US007226849B2

(12) United States Patent  
Stavrinou et al.

(10) Patent No.: US 7,226,849 B2
(45) Date of Patent: Jun. 5, 2007

(54) METHOD OF PRODUCING INTEGRATED SEMICONDUCTOR COMPONENTS ON A SEMICONDUCTOR SUBSTRATE

(75) Inventors: Paul Nicholas Stavrinou, London (GB); Timothy Simon Jones, Surrey (GB); Gareth Parry, Herts (GB)

(73) Assignee: EPIIC Limited, London (GB)

( * ) Notice: Subject to any disclaimer, the term of this patent is extended or adjusted under 35 U.S.C. 154(b) by 231 days.

(21) Appl. No.: 10/497,203

(22) PCT Filed: Nov. 26, 2002

(86) PCT No.: PCT/GB02/05318

§ 371 (c)(1),
(2), (4) Date: Aug. 13, 2004

(87) PCT Pub. No.: WO03/049160

PCT Pub. Date: Jun. 12, 2003

(65) Prior Publication Data

US 2004/0266144 A1 Dec. 30, 2004

(30) Foreign Application Priority Data

Nov. 30, 2001 (GB) ................. 0128743.2

(51) Int. Cl.
*H01L 21/20* (2006.01)
*C30B 25/02* (2006.01)
(52) U.S. Cl. ................. 438/478; 119/89; 257/E21.108
(58) Field of Classification Search ........ 438/478–492, 438/503–509; 119/84–109
See application file for complete search history.

(56) References Cited

U.S. PATENT DOCUMENTS

| 4,961,198 | A | 10/1990 | Ishino et al. |
| 5,185,289 | A | 2/1993 | Meier et al. |
| 5,436,194 | A | 7/1995 | Kondo et al. |
| 5,901,265 | A | 5/1999 | Tohyama et al. |
| 6,399,404 | B2 * | 6/2002 | Sakata .................. 438/22 |
| 6,403,451 | B1 * | 6/2002 | Linthicum et al. ......... 438/479 |
| 6,579,780 | B2 * | 6/2003 | Takahashi ............. 438/479 |
| 6,865,207 | B1 * | 3/2005 | Kawanishi et al. ........ 372/50.1 |
| 6,868,214 | B1 * | 3/2005 | Sakata et al. ........... 385/129 |
| 2001/0002048 | A1 * | 5/2001 | Koike et al. ............. 257/80 |
| 2001/0012678 | A1 * | 8/2001 | Tanaka et al. ........... 438/481 |
| 2002/0137249 | A1 * | 9/2002 | Ishida et al. ............. 438/47 |
| 2003/0123829 | A1 * | 7/2003 | Taylor .................. 385/131 |

FOREIGN PATENT DOCUMENTS

| EP | 0 653 822 A1 | 5/1995 |
| EP | 0 952 470 A2 | 10/1999 |

OTHER PUBLICATIONS

Borchert et al., *1.29 μm GaInNAs multiple quantum-well ridge-waveguide laser diodes with improved performance*, Electronics Letters, Electronics Letters, IEE Stevenage, GB, vol. 35, No. 25, Dec. 9, 1999, pp. 2204-2206, XP006013084.

(Continued)

*Primary Examiner*—Chandra Chaudhari
*Assistant Examiner*—Matthew W. Such
(74) *Attorney, Agent, or Firm*—Nixon & Vanderhye P.C.

(57) ABSTRACT

There is provided a method of producing multiple semiconductor components on a substrate, said method comprising the steps of: forming a predetermined relief pattern on a surface of said substrate; and epitaxially depositing a layer formed of a mixture of two or more Group III elements and two or more Group V elements on said surface; wherein said relief pattern results in said layer deposited in a single step forming with a different ratio between said Group V elements within areas having different relief pattern characteristics so as to provide different band gaps within said different areas.

16 Claims, 6 Drawing Sheets

OTHER PUBLICATIONS

Arai et al., *Monolithic Formation of Metal Organic Chemical Vapor Deposition Grown Multi-wavelength Verical Cavities with Highly Strained GaInAs/GaAs Quantum Wells on GaAs (#11)B*, Japanese Journal of Applied Physics, Publication Office Japanese Journal of Applied Physics., Tokyo, JP, vol. 40, No. 6A, part 1, Jun. 2001, pp. 4056-4057, XP001078652.

Ortiz et al., *Monolithic Wavelength-Graded VCSEL and Resonance-Enhanced Photodetector Arrays for Parallel Optical Interconnects*, Lasers and Electro-Optics Society Annual Meeting, 1997, LEOS '97 10th Annual Meeting, Conference Proceedings, IEEE, San Francisco, CA, USA, Nov. 10-13, 1997, New York, NY, USA, IEEE, US, Nov. 10, 1997, pp. 79-80, XP010252705.

Arai et al; "Monolithic Formation of Metal Organic Chemical Vapor Deposition Grown Multi-Wavelength Vertical Cavities With Highly Strained Gains/GAAS Quatum Wells on GAAS (311)B"; Japanese Journal of Applied Physics, Publication Office Japanese Journal of Applied Physics., Tokyo, JP, vol. 40, No. 6A, part 1, Jun. 2001, pp. 4056-4057, XP001078652.

Ortiz et al; "Monolithic Wavelength-Graded VCSEL and Resonance-Enhanced Photodetector Arrays for Parallel Optical Interconnects"; Lasers and Electro-Optics Society Annual Meeting, 1997, LEOS '97 10th Annual Meeting, Conference Proceedings, IEEE, San Francisco, CA, USA, Nov. 10-13, 1997, New York, NY, USA, IEEE, US, Nov. 10, 1997, pp. 79-80, XP010252705.

Borchert et al; "1.29 µm GaInNAs Multiple Quantum-Well Ridge-Waveguide Laser Diodes With Improved Performance" Electronics Letters, IEE Stevenage, GB, vol. 35, No. 25, Dec. 9, 1999, pp. 2204-2206, XP006013084.

* cited by examiner original substrate pre-patterned substrate cross-section through AA

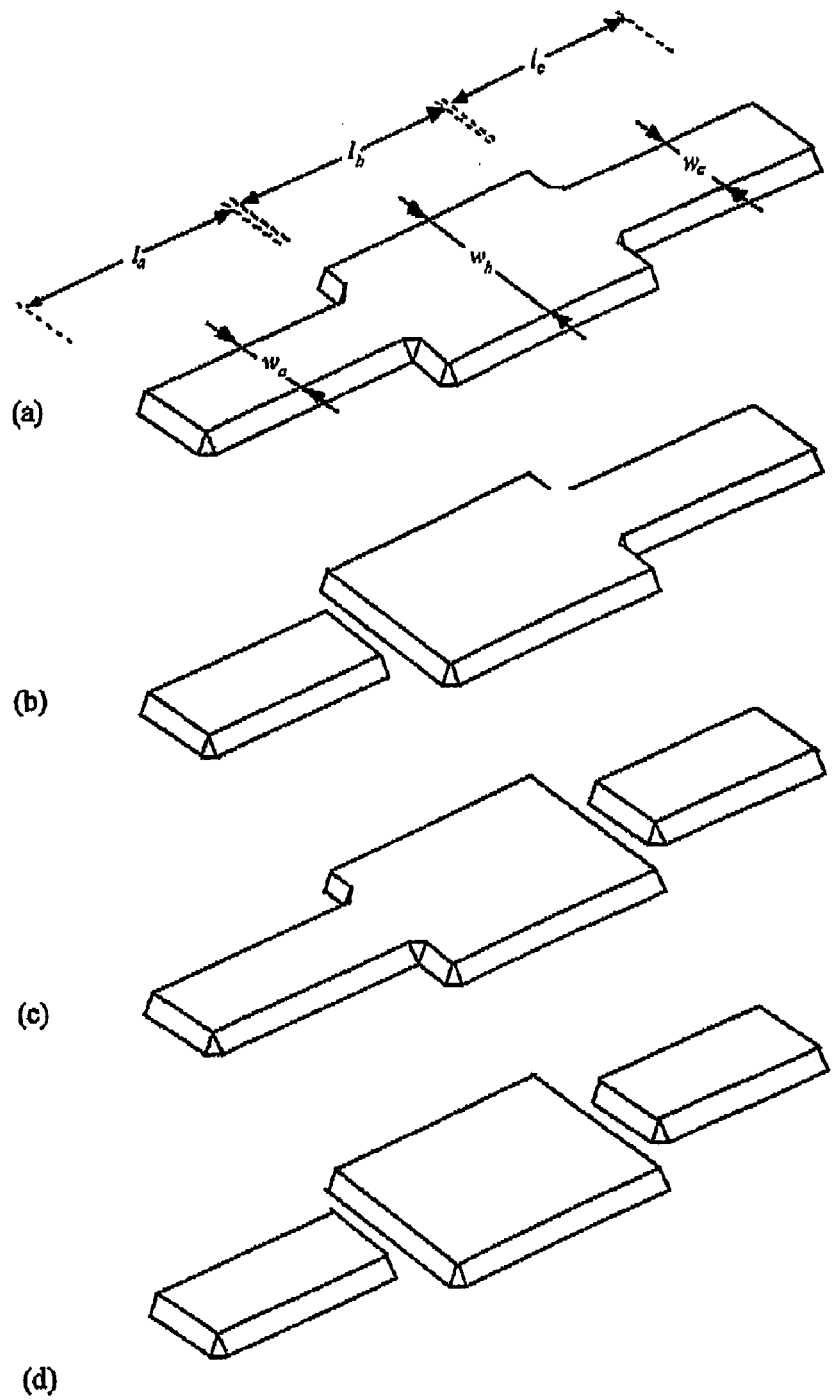
Figure 6(a)-(d)

METHOD OF PRODUCING INTEGRATED SEMICONDUCTOR COMPONENTS ON A SEMICONDUCTOR SUBSTRATE

This application is the US national phase of international application PCT/GB02/05318 filed in English on 26 Nov. 2002, which designated the US. PCT/GB02/05318 claims priority to GB Application No. 0128743.2 filed 30 Nov. 2001. The entire contents of these applications are incorporated herein by reference.

This invention relates to the field of semiconductor component formation on substrates and to semiconductor components so formed. More particularly, this invention relates to a method of producing integrated semiconductor components by means of epitaxial growth.

A major field of application of semiconductor optical devices is in optical fibre communications systems. Silica optical fibres have loss minima around 1.3 and 1.55 µm approximately. Accordingly, there is a special need for devices operating in the range from 1.3 to 1.6 µm. To date the majority of semiconductor devices operating in this region are based on InP substrates and typically comprise layers derived from the quaternary alloys of indium gallium arsenide phosphide (InGaAsP) or aluminium gallium indium arsenide (AlGaInAs). (It is understood that binary and ternary combinations from a general quaternary are often selected although we will generally refer to layers as being an alloy, except where the context indicates otherwise.) By a suitable choice of the relative components it is possible to control the band gap of an alloy layer to occur within the 1.3 to 1.6 µm wavelength range, while also allowing good quality epitaxial growth of an alloy layer on InP substrates. In many cases it is possible that the alloy may have a different bulk lattice constant than the dominant lattice constant of the structure (i.e. usually the substrate). Providing the differences in lattice constants are not too great, the alloy layer can elastically deform during the growth process; the deposited alloy layer is then said to be strained. It is recognised that many present day devices comprise lattice matched and strained alloy layers in quantum well systems (QW). Strained layers in particular produce significant operational benefits in terms of the electronic and optical properties of a device. However, as is well established, the amount of strain a layer can accommodate for a given thickness is limited. Above a certain strain-thickness product the layer or layers tend to preferentially generate dislocations to relieve the strain in the layer. The presence of a large number of dislocations in and around the active layers can severely degrade optical and electronic properties of the layer and consequently the overall device performance. Nevertheless within these constraints, the current material technology is well established and able to produce a wide variety of devices, including lasers, modulators, detectors and amplifiers operating over the region 1.3 to 1.6 µm and all based on InP substrates.

The increasing availability of large area GaAs substrates (currently up to 6 inch diameters) has several attractive consequences for large scale manufacturing of optoelectronic devices. In the first instance, the higher device yield per wafer would help reduce the costs of each device. In addition, the integration of several device components, e.g. a laser and modulator, would become more attractive with the larger substrate areas. However the requirement of high quality epitaxial growth of materials with a band gap in the desired wavelength range (1.3 to 1.6 µm) has, until recently, excluded the possibility of epitaxially depositing quantum well material on GaAs substrates. For example, the ternary alloy of InGaAs is routinely deposited on GaAs substrates and often forms the well layer in a strained QW system. Indeed laser devices based on this QW system are often used for optically pumping Er-doped fibre amplifiers. However, in order to achieve good quality epitaxial growth, the indium composition is typically limited to values <20% and consequently the band edge of the strained InGaAs layer has a long wavelength limit of around 1 µm. In 1995 researchers at Hitachi Laboratory in Japan proposed and demonstrated an alternative semiconductor material, namely gallium indium nitride arsenide (GaInNAs) which could be epitaxially grown on a GaAs substrate. The Hitachi group found that a small incorporation of nitrogen (typically <1%) into the InGaAs alloy was sufficient to enable a higher concentration of In to be used (typically 30%) while still maintaining a bulk lattice constant close to GaAs. High quality growth could be achieved and the key result was a light-emitting material having a band gap energy suitable for long-wavelength (1.3 to 1.6 µm) operation (Kondow et al, *Japanese Journal of Applied Physics,* 1996, 35 pp 1273–1275).

The quantum well systems that followed used the GaIn-NAs alloy as the well material along with GaAs, or other wide band gap materials that can be grown on a GaAs substrate, as the barriers. The Hitachi group were the first to demonstrate in-plane laser diodes, epitaxially grown on GaAs substrates and significantly, operating around 1.3 µm. Other groups have since become involved in the area, which has very quickly become a blossoming area of research, covering basic material physics through to laser diode structures. The variety of laser diode structures demonstrated to date include vertical cavity laser diodes (Larson et al, *Electronic Letters,* 1997, pp 959–960). As previously noted, the ability to produce device structures operating between 1.3 to 1.6 µm directly on GaAs substrates is a significant benefit of the GaInNAs QW system. This QW system also demonstrates several important advantages compared against the commonly used inP based QW systems comprising alloy combinations from the quaternary InGaAsP, i.e.:

(i) better high temperature performance of laser structures is achieved due to a larger conduction band offset and, thus, improved electron confinement; and (ii) an increase of the electron effective mass with the addition of nitrogen providing a closer match between the effective mass values for electrons and holes.

Such advantages of a GaInNAs QW system are not specific to laser diode structures, e.g. it is clear that semiconductor optical amplifiers (SOA) and a variety of modulator structures are all be expected to benefit.

The significance of the GaAs substrate compatibility and the improvements noted above is readily apparent when placed in the context of likely component requirements for future optical networks. To handle the increased traffic, a wavelength channel in future optical fibre communications networks will be expected to operate at, or beyond, 40 Gb/s. Such modulation rates are not easily achieved by direct modulation of a laser diode. In this situation, external modulation is the likely alternative, and combined with an laser diode, will become an essential part of these advanced networks. Along these lines there are several integrated device combinations which are attractive from a systems perspective. The integration of a laser diode and electro-absorption modulator (EAM) is one example. It will be clear that the techniques disclosed herein are applicable to a wide range of devices including many different integrated component combinations.

An important issue when integrating combinations of components is that the preferred quantum well design for one component may not coincide with the requirement of the other. In the case of a QW laser diode and an EAM, both comprising identical QW systems, the emission wavelength from the laser can spectrally coincide with significant absorption in an active region of the basic modulator structure. While significant absorption may be acceptable for a detector component (although not necessarily optimal) this absorption is not desirable to for an EAM. Depositing the structures at the same time with a common epitaxial deposition step will produce a layer having matching band gaps and so prone to the above problem. A better situation has the QW system in the EAM modulator arranged so the absorption band edge occurs at a shorter wavelength (higher energy) than the laser emission wavelength, thus, producing a high transmission state. Application of an external applied field causes an increase in the absorption coefficient at the operating wavelength via the quantum confined Stark effect (QCSE) and defines the low transmission state. Consequently an integrated optical chip incorporating two or-more components requires some local or selective control of the QW electronic and optical properties. Several post growth techniques for providing this control have been reported to date which include various disordering techniques to induce local changes of composition and dimensions of the QW system. Examples of these techniques are Impurity Induced Disordering (IID) and Impurity-Free Vacancy Disordering (IFVD). Although the use of these post-growth techniques obviates the need for multiple step epitaxial regrowth (a single layer can be grown and modified post-growth), additional steps are required to carry out these procedures, and masking will still be required in order to affect localised areas of the layer only.

Strained quantum wells of GaInAs can be grown epitaxially on GaAs substrates. The conditions for achieving particular compositions (i.e. percentage indium content) and thickness are well established on planar substrates. If GaAs (or GaAlAs) is subsequently deposited on top of the GaInAs layers, then the GaInAs layers form quantum wells which can confine electrons and holes and determine the optical properties of the semiconductor.

Viewed from one aspect the present invention provides a method of producing multiple semiconductor components on a substrate, said method comprising the steps of:

forming a predetermined relief pattern on a surface of said substrate; and epitaxially depositing a layer formed of a mixture of two or more Group III elements and two or more Group V elements on said surface wherein two of said Group III elements are Gallium (Ga) and Indium (In), and one of said Group V elements is Nitrogen (N); and wherein said relief pattern results in said layer deposited in a single step forming with a different ratio between said Gallium (Ga) and Indium (In) within areas having different relief pattern characteristics the ratio between the Gallium (Ga) and the Indium (In) influencing the amount of Nitrogen (N) which is incorporated into said layer, the different Nitrogen (N) incorporation within said different areas providing different band gaps within said different areas.

Using the above described method, integrated semiconductor components can be formed on a substrate using fewer epitaxial manufacturing steps, reducing cost and complexity.

The technique recognises and exploits a combination of effects. The relief characteristics may be used to control the ratio of Group III elements deposited in a location which in turn can alter the ratio of Group V elements at that point and the band gap of the material at that point. Thus in a single epitaxial deposition step relief characteristics can be used to allow portions having different band gaps to be simultaneously deposited.

While it can be appreciated that the Group III elements can be selected from many combinations, in preferred embodiments the Group III elements are Gallium (Ga) and Indium (In). The relative composition of Gallium (Ga) and Indium (In) in a layer formed by epitaxy which comprises these elements is found to be strongly influenced by said relief pattern characteristics of said substrate (e.g. K. Kamath, P. Bhattacharya, J. Singh, Journal of Crystal Growth 175/176 (1997) pp 935–939). The relative composition of Gallium (Ga) and Indium (In) in turn influences the relative composition of the Group V elements, which then in turn influences the band gap of the layer. These influences contribute to flexible control of band gaps.

While it can also be appreciated that the Group V elements can be selected from many combinations, in preferred embodiments two of the Group V elements are Arsenic (As) and Nitrogen (N). The presence of Nitrogen in the layer formed by epitaxy allows high quality layers to be grown with a high Indium content. The combined effect provides greater flexibility in choosing a suitable band gap.

In other preferred embodiments, two of the Group V elements are Arsenic (As) and Antimony (Sb). This combination of Group V elements is also found to be suitable for band gap control.

While it can be appreciated that the semiconductor components can be selected from a number of different types, in preferred embodiments at least one of said semiconductor components is a photonic component. Preferred embodiments of the method of the invention are well suited to producing photonic components which require sensitive control of band gaps.

In these and other preferred embodiments at least one of said semiconductor components is an electronic component. Preferred embodiments of the method of the invention are also well suited to producing electronic components.

Furthermore, embodiments of the invention in which at least one photonic component and at least one electronic component are produced may be particularly valuable for a number of applications requiring a mixture of the two component types.

While it can be appreciated that the semiconductor components are not limited to particular configurations or architectures, in preferred embodiments a plurality of the semiconductor components are separate components. This architecture type enables, for example, multiple independent components to be formed on the substrate.

In these and other preferred embodiments, a plurality of the semiconductor components are linked components. The formation of linked semiconductor components on the substrate facilitates the construction of integrated systems whereby the individual components can interact and work together. In addition where both separate and linked components are formed on the same substrate, these combinations of components can serve to advantageously produce semiconductor devices of almost any configuration.

While it can be appreciated that said relief pattern can be formed using a number of different methods, in preferred embodiments the relief pattern forming step is carried out by selectively etching the substrate. Selective etching of a substrate can be performed relatively simply and inexpensively.

In other preferred embodiments, said relief pattern forming step is carried out by covering said substrate with a thin dielectric layer and subsequently removing said dielectric layer from selected areas. Epitaxial growth on a relief pattern formed in this way will behave differently, forming a layer with different, and in preferred embodiments advantageous, electronic and optical properties.

While it can be appreciated that the relief pattern can comprise structures of a number of different geometries, in preferred embodiments the relief pattern comprises ridges bordered by sloping facets. Relief patterns using this geometry control the epitaxial growth process in a well-defined manner, enabling fine control of the band gaps associated with particular areas of the substrate.

While it can be appreciated that the slope of said facets can take a number of different angles, preferred embodiments use a slope corresponding to the crystal structure integer indices (n 1 1). In preferred embodiments, this angle of slope has been found to promote an appropriate degree of movement of atoms from the sides of a relief structure to the top surface of said relief structure. The slope (3 1 1) is particularly preferred.

While it can be appreciated that various properties of a ridge (such as the angle of its slope, its height and whether it has curved or sharp edges) can be used to define its relief pattern characteristics, in preferred embodiments said relief pattern characteristics are defined by the ratio of its surface area to its edge length. This enables a component designer to use a clearly defined and flexible framework for designing one or more components on a substrate.

While it can be appreciated that epitaxial deposition can be carried out using a number of techniques and mechanisms, in preferred embodiments the epitaxial deposition step is carried out using molecular beam epitaxy (MBE). The use of molecular beam epitaxy provides excellent uniformity within a layer combined with a very low defect rate. It can be readily utilised to promote epitaxial growth on pre-patterned substrates formed by a number of mechanisms, including selectively etched substrates and substrates having a relief pattern formed using a dielectric layer.

In other preferred embodiments the epitaxial deposition step is carried out using molecular organic vapour phase epitaxy (MOVPE or MOCVD). The use of molecular organic vapour phase epitaxy provides relatively rapid deposition and can be implemented at a commercial scale relatively easily. This form of epitaxial deposition is also particularly well suited for use with a substrate having a relief pattern formed using a dielectric layer.

Viewed from another aspect the present invention is a semiconductor device produced in accordance with a method of producing multiple semiconductor components on a substrate, said method comprising the steps of:

forming a predetermined relief pattern on a surface of said substrate; and epitaxially depositing a layer formed of a mixture of two or more Group III elements and two or more Group V elements on said surface wherein two of said Group III elements are Gallium (Ga) and Indium (In), and one of said Group V elements is Nitrogen (N); and wherein said relief pattern results in said layer deposited in a single step forming with a different ratio between said Gallium (Ga) and Indium (In) within areas having different relief pattern characteristics the ratio between the Gallium (Ga) and the Indium (In) influencing the amount of Nitrogen (N) which is incorporated into said layer, the different Nitrogen (N) incorporation within said different areas providing different band gaps within said different areas.

Preferred embodiments of this aspect of the invention are provided in accordance with the aforementioned preferred embodiments of the first aspect of the invention.

For a better understanding of the present invention, reference will now be made, by way of example, to the accompanying drawings, in which:

FIGS. 6A to 6D illustrate the construction of a monolithic integrated component.

Figure 1A:
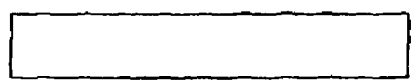
FIGS. 1A and 1B illustrate a section of substrate before and after etching respectively.
Figure 1B:
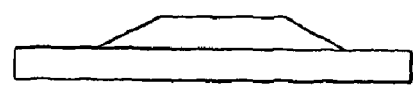

A first embodiment of the invention provides multiple semiconductor components on a substrate using molecular beam epitaxy (MBE) to grow Gallium Indium Arsenide Nitride (GaInAsN) layers. According to this embodiment, GaInAsN is grown epitaxially on a pre-patterned substrate of Gallium Arsenide (GaAs). By "pre-patterned" we mean that the substrate is selectively etched, removing GaAs in certain regions so as to form one or more long thin ridges with width of order a few microns. FIGS. 1A and 1B show the cross section of such a substrate before and after etching has taken place respectively.

The trapezoid shape on the patterned substrate (FIG. 1B) is the section of GaAs which has not been removed by selective chemical or dry etching. Important parameters defining this section are its width (which should be of the order of a few microns or less) and the slope of the sides. The slope of the side sections can be determined by choosing the etching conditions to produce a particular crystal facet (identified by the integer indices (n m p), for example (3 1 1)). In the third dimension the cross-section for this embodiment remains constant for at least several tens of microns. MBE growth of GaInAsN on this patterned substrate occurs through deposition of Ga, In, As and N on to the top surface of the ridge and also through movement of atoms deposited on the side facets, from those facets, on to the top surface. Lateral composition changes are achieved due to the differences in surface migration lengths of the atoms. Consequently the percentage indium composition and thickness of the GaInAsN layers on the top of the ridge will depend on the width of the ridge, the orientation of the side facets and the parameters that influence the mobility of the Ga, In, As and N atoms.

Figure 2:
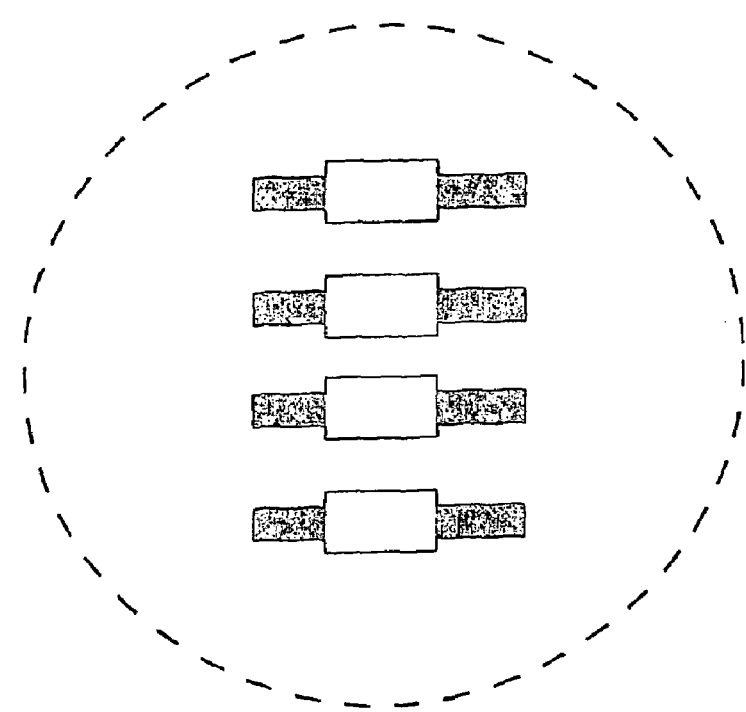
FIG. 2 is illustrates a pre-patterned circular substrate prepared for the integration of two or more devices onto its surface.

The amount of nitrogen which can be incorporated will be very strongly influenced by the relative composition of Ga and In, and so the nitrogen content of GaInAsN grown on a pre-patterned substrate (such as that shown in FIG. 1B) will also be determined by the width of the top of the ridge and the orientation of the facets forming the sides of the ridge. Since the nitrogen content of the GaInAsN layers strongly influences the band gap of the semiconductor layer then we can control the bandgap of the GaInAsN layers by carrying out MBE growth on pre-patterned substrates. This is exactly the feature required for the integration of different semiconductor devices on a single substrate. To integrate two or more devices onto a single substrate the substrate can be pre-patterned in a manner illustrated schematically for a patterned circular substrate (FIG. 2).

In this case the shaded regions have the same width and are defined by the same facet slopes but the unshaded region linking the two shaded regions is approximately three times the width of the shaded regions. Consequently the growth of GaInAsN on this substrate will result in the deposition of material on all regions of the surface but the material deposited on to the uncoloured region will have a different composition and therefore band-gap from that deposited on the shaded region.

There may, of course, be a requirement to deposit a number of other layers of, for example, GaAlAs or GaAs, depending on the type of device which is being produced. However, the method described provides that in a single epitaxial deposition step, relief characteristics of the underlying substrate can be used to allow portions of the layer having different band gaps to be simultaneously deposited. An advantage of this embodiment is that the pre-patterning of the GaAs substrate prior to MBE deposition of GaInAsN provides the basis of component integration by band-gap tuning when utilising GaInAsN quantum wells.

Figure 3A:
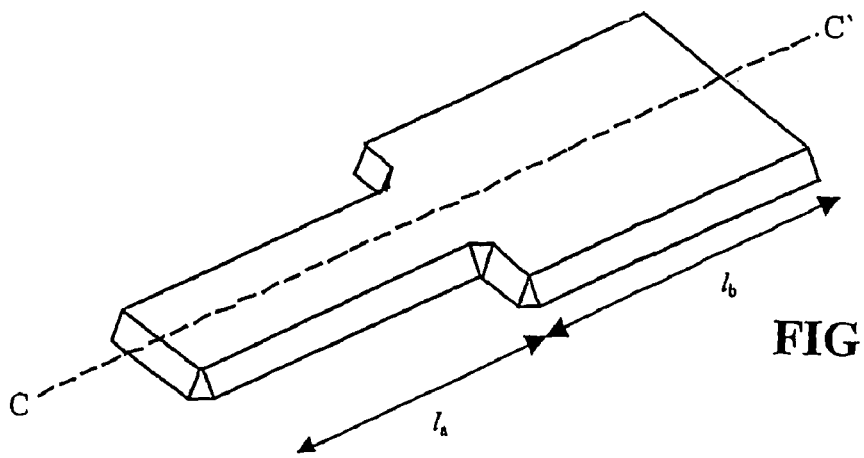
FIGS. 3A to 3C illustrate a relief pattern formed on the surface of a substrate and the resulting variation (along the length of the ridge) in composition and band edge of a subsequently grown layer.
Figure 3B:
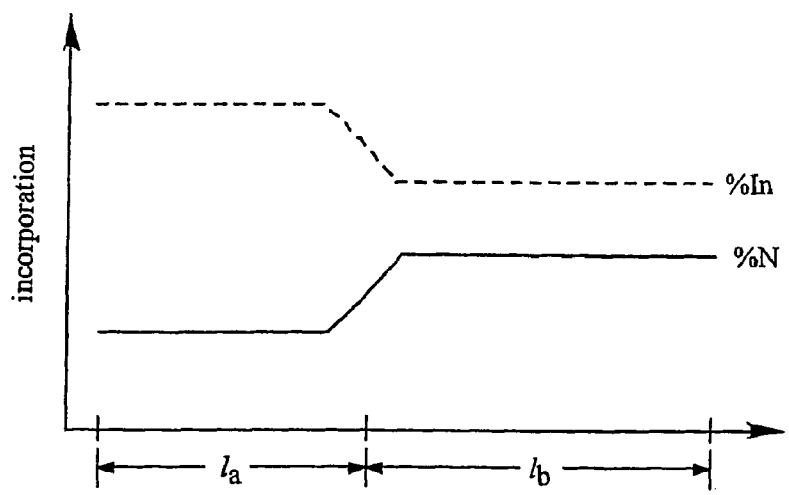
Figure 3C:
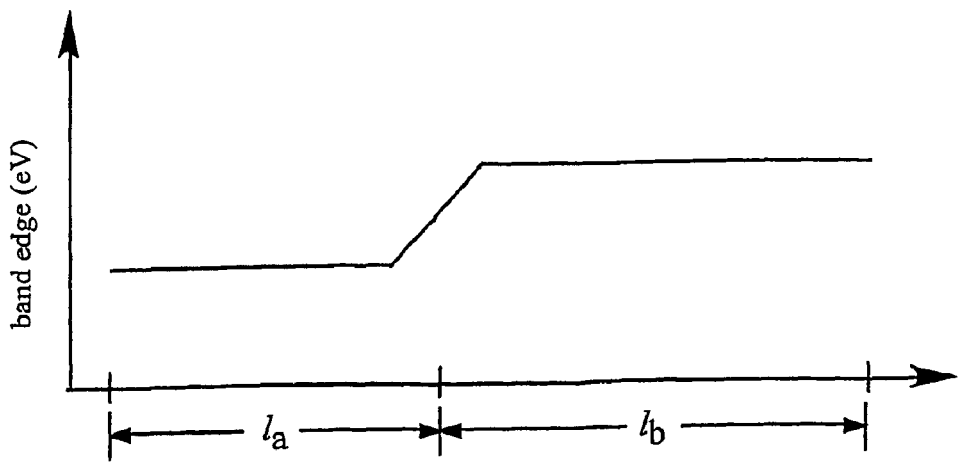

An example of a pre-patterned substrate relief pattern is illustrated in FIG. 3A. The ridge shown can be considered in two sections, both being bisected along their length by the dashed line C–C', the first, thinner, section having length $l_a$, and meeting the second, wider, section having length $l_b$. FIG. 3B shows the incorporation of both Indium (% In) and Nitrogen (% N) at any given point along the line C–C'. It should be noted that the wider section of ridge results in a lower incorporation of Indium, and a consequentially higher incorporation of Nitrogen. FIG. 3C shows the band edge at any given point along the line C–C'. It is clear from a comparison of FIGS. 3B and 3C that the band edge associated with a region of ridge is directly proportional to the Nitrogen incorporation in that region, which is in turn related to the width of the ridge. However, it is important to understand that the width of the ridge is not the only factor which contributes to the composition of the layer, and nor is the Indium incorporation the only factor which contributes to the Nitrogen incorporation. It is clear however that the relief characteristics (in this case ridge geometry) may be used to control the ratio of two Group III elements (in this case Gallium and Indium) deposited in a location, which in turn can alter the ratio of Group V elements at that point and thus the band gap of the material at that point.

Figure 4A:
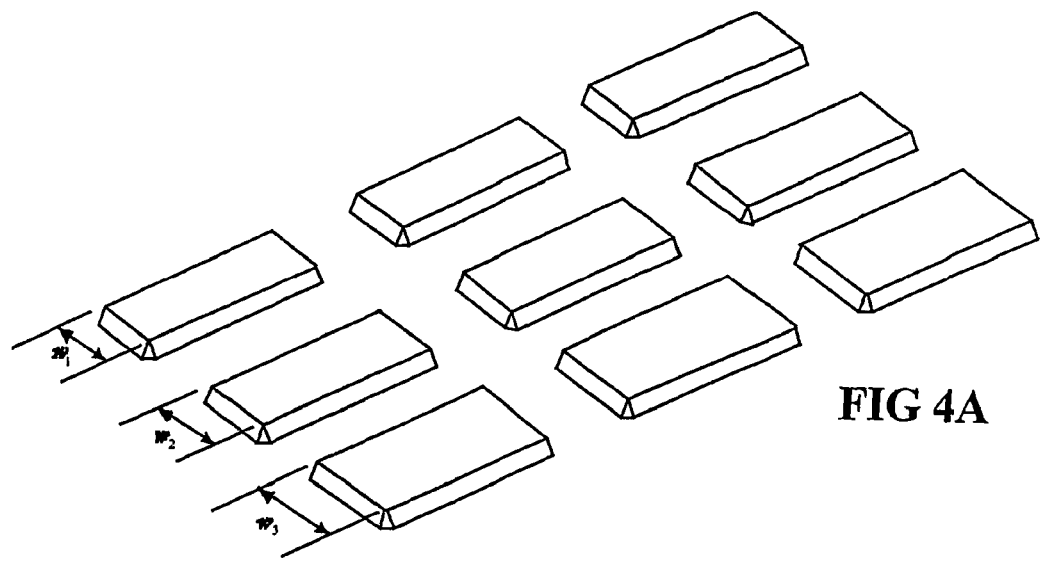
FIGS. 4A to 4E illustrate another relief pattern formed on the surface of a substrate, this pattern comprising an array of separate ridges (4A) having a geometry described by 4B and 4C, the resulting variation in composition and band edge of a subsequently grown layer being described by 4D and 4E.
Figure 4B:
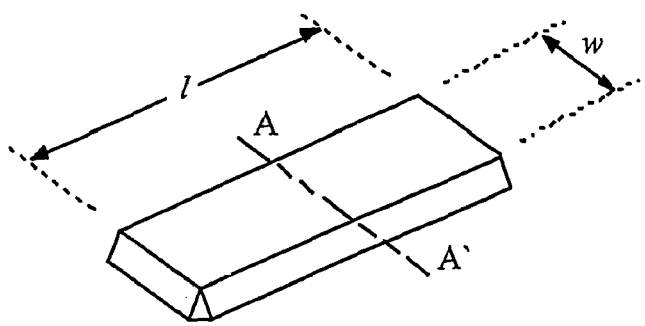
Figure 4C:
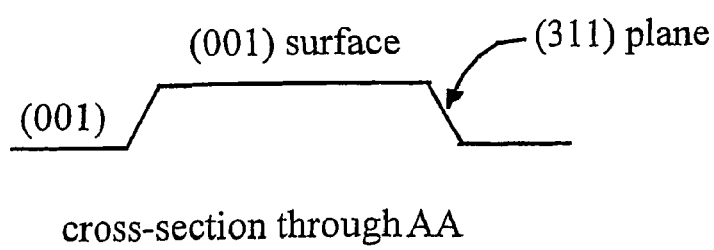

Another example relief pattern is illustrated in FIG. 4A. This pattern comprises an array of separate ridges, providing a spatial variation in band gap based on the lengths and widths of the individual ridges and the spaces between them. An individual ridge from this array is illustrated in FIG. 4B, with the ridge being bisected across its width by the dashed line A–A'. The cross section of the ridge along line A–A' is illustrated in FIG. 4C, in which the crystal indices of the horizontal planes are shown to be (0 0 1) and the crystal indices of the facet edges are shown to be (3 1 1). It should be noted that the crystal indices are not limited to these values, and in various embodiments can take any value which facilitates the migration of atoms from the facets to the top of the ridge, the differing crystal facets providing an appropriate variation in the kinetic behaviour of the atoms.

Figure 4D:
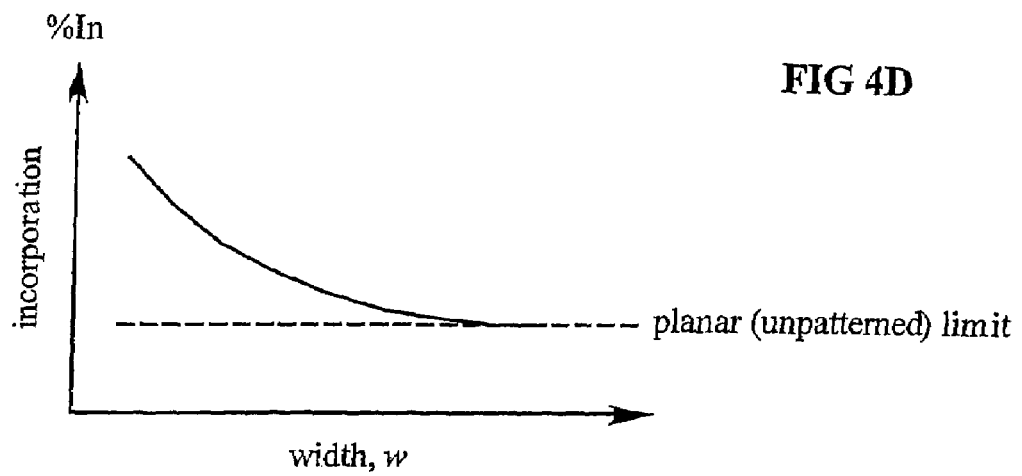
Figure 4E:
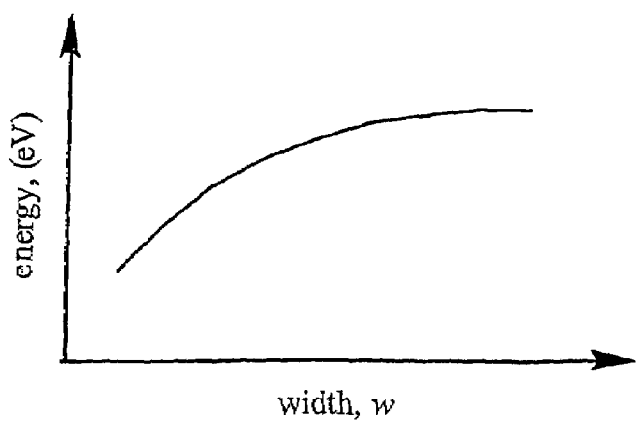

FIG. 4D illustrates the relationship between the width of a ridge and the incorporation of Indium in an epitaxially grown layer. It can be seen that the Indium incorporation decreases as the width of the ridge increases, with the Indium concentration "bottoming out" at a concentration corresponding to that expected with a planar unpatterned substrate. FIG. 4E shows the band edge of an epitaxially grown layer to increase as the width of the ridge increases, the band edge being found to be substantially proportional to the reciprocal of the Indium incorporation.

Figure 5A:
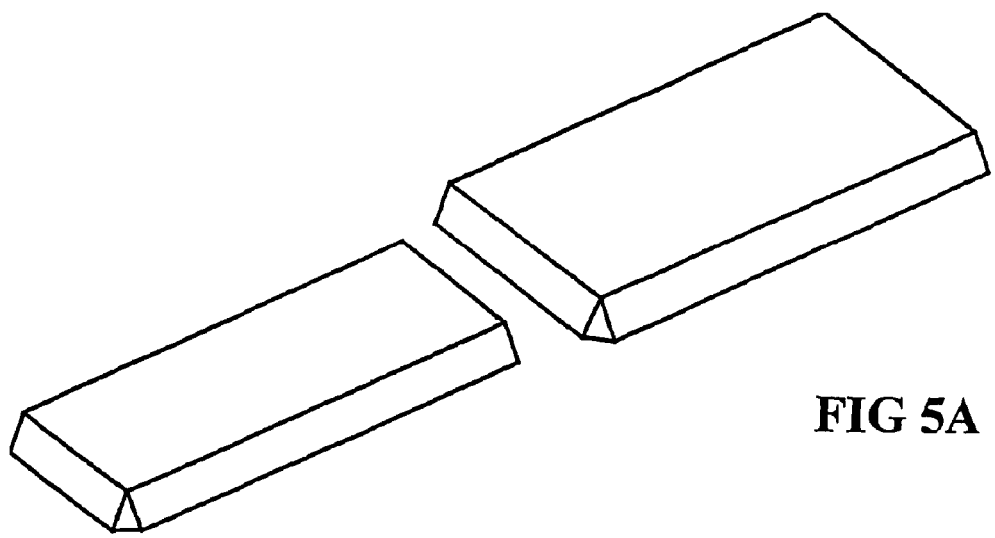
FIGS. 5A and 5B illustrate yet another relief pattern formed on the surface of the substrate and the resulting variation in composition of a subsequently grown layer.
Figure 5B:
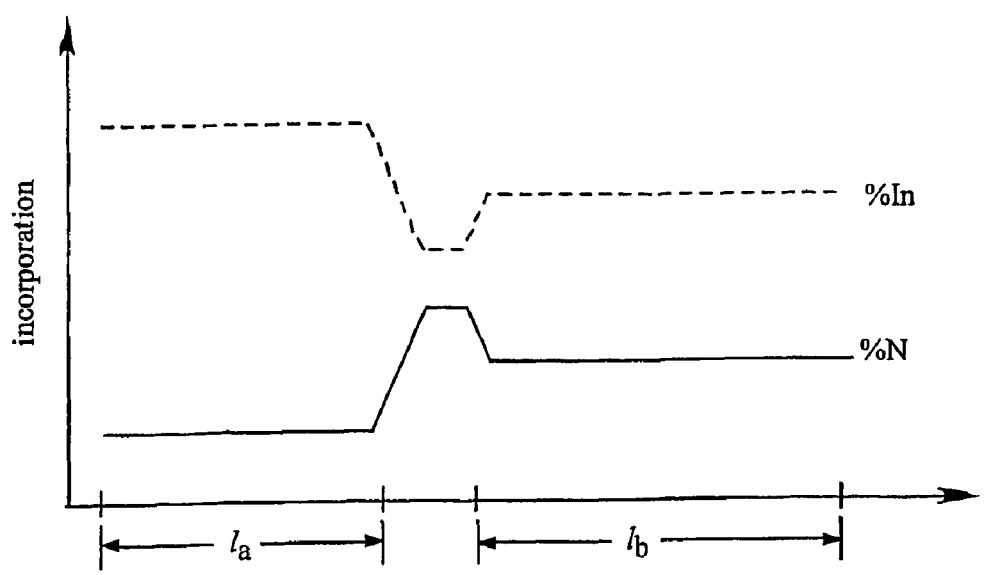

Yet another example relief pattern is illustrated in FIG. 5A. The two ridges shown are separated by a gap, the impact of the gap on the incorporation of Indium and Nitrogen being illustrated in FIG. 5B. It can be seen that the gap causes a decrease in the Indium incorporation in that region, and consequently an increase in the Nitrogen incorporation and hence band gap for that that region.

These various examples of relief patterns provide some insight into how the band gap of epitaxially grown layers on a substrate can be manipulated to provide a desired spatial variation. It is emphasised that the relief patterns are not limited to shapes of a particular geometry (e.g. ridges) but can comprise shapes of any geometry, for example a trench.

The principles illustrated with reference to the drawings apply equally to different combinations of Group III and Group V layer materials, and also to different substrate compositions. Various embodiments of the invention may comprise layers which have been doped in order to exhibit certain characteristics. The methods described apply equally well to doped materials.

A second embodiment of the invention provides multiple semiconductor components on a substrate using molecular organic vapour phase epitaxy (MOVPE or MOCVD). Epitaxial re-growth on pre-patterned substrates (the substrates of the first embodiment) can also be used with MOVPE growth techniques. The mechanism described above for MBE will apply to some extent but an alternative method may also be used. The alternative method involves defining the patterned regions of the substrate by first covering the entire substrate with a thin dielectric layer of, for example, silicon oxide or nitride and subsequently removing that dielectric material from selected areas. The shape of the regions where the dielectric material is removed would typically be long thin regions with dimensions similar to those defining the ridge structures described previously for the first embodiment. Consequently pre-patterned substrates formed using this technique would consist of a GaAs substrate with one or more thin layers of dielectric material deposited onto the surface, the dielectric layers having long, narrow windows open to provide access to the GaAs substrate in restricted regions. MOVPE growth on such a substrate would occur in the open regions but not on the regions where the dielectric remains. The composition and thickness of the GaInAsN deposited in the open windows will be dependent on the width of the open window. Consequently component integration can occur by pre-patterning the surface with dielectric materials and opening windows of pre-determined widths to form GaInAsN quantum wells suitable for lasing, modulation, detection or various other applications.

An example demonstrating the construction of a monolithic integrated component is shown in FIG. 6. The top FIG. (6A) shows one possible pre-patterned substrate relief pattern for integrating three components. The constituent parts of the pattern may be defined by their length (l) and width (w). In the case of FIG. 6A, these dimensions would not necessarily describe the whole pattern but rather indicate principal regions of the pattern where the dimensions are chosen to produce a desired energy band gap following the previous discussions. Other possible patterns are shown in FIGS. 6B–D, which could be used for the same set of integrated components.

One preferred configuration involves integrating a laser section, modulator section and an amplifier section. Such a configuration requires laser control of the band gaps of the three components. For example, while the laser and amplifier sections may have the same band gaps, it is generally desirable for the modulator nad gap to be higher in energy. Through the dimensions of the pre-patterned sections, principally the widths, the band gaps in each section will differ. It should also be clear that all three sections may be defined to have different widths, and in accordance with embodiments of the present invention, all three components, the laser, modulator and amplifier sections will all have different band gaps.

In operation, the output from the laser section enters the modulator section where it may propagate in either a "lossless" regime, i.e. with low absorption in the modulator section, or "attenuated" regime, i.e. where the absorption in the modulator section is high. The amount of absorption at the lasing wavelength is governed by the spectral proximity of the band gap in the modulator section compared to the lasing wavelength. For example, this maybe externally adjusted using an applied electric. In this instance, controlling the applied field provides the means of modulation, a desired signal level may be temporally impressed on the intensity of the beam. The modulated beam may then be sent into the amplifier section, which may have the band gap different to both the laser and modulator sections but spectrally positioned, by the dimensions of the section, to provide sufficient gain to the modulated beam. Such a configuration, particularly the amplifier section, may be advantageously used to counteract alignment losses in optoelectronic modules. However, it should be clear that it is not the details of the operation, or indeed the arrangement of components, that is the issue here. Rather, it is the ability to arrive at some local control of the band gap through the pre-patterning technique that enables the integration of components.

This embodiment of the invention provides an alternative and, for some applications preferable, way of spatially controlling the composition, and hence the band gap, of an epitaxially grown layer on a substrate. Other epitaxial growth techniques, and potentially combinations of different techniques, can also be used to provide similar control.

With both these and other embodiments of the invention the surface of the substrate can be taken to mean the surface that is ready for epitaxial growth, which could include epitaxial layers deposited previously in the growth run or produced earlier from a separate growth run.

As previously described, preferred embodiments of the invention provide for a plurality of the semiconductor components to be linked components. Such integration of these components can be applied, among other things, to the formation of such combinations as:

(a) an integrated in-plane laser and electro-absorption modulator;
(b) an integrated in-plane laser and electro-refraction modulator;
(c) an integrated in-plane semiconductor optical amplifier (SOA) and a modulator;
(d) an integrated in-plane laser and a passive optical waveguide;
(e) an integrated in-plane semiconductor optical amplifier (SOA) and a passive optical waveguide;
(f) an integrated passive waveguide and an in-plane optical detector;
(g) a field effect transistor (FET) and one or more photonic components.

In addition, some applications may require separate components to be co-fabricated on a substrate, and the techniques described will apply equally well to these.

It should be noted that the above description concentrates on the "active" regions of the optoelectronic devices, e.g. where the light is mainly localised (passive waveguide), or generated (as in a laser), or amplified (as in an amplifier), or absorbed (as in a detector). Complete devices (i.e. lasers, amplifiers, etc.) will involve several other layers to form a complete device. These may be doped layers to aid conductions of current or application of electric fields, or simply used as cladding regions for the guiding process.

The invention claimed is:

1. A method of producing multiple semiconductor components on a substrate, said method comprising the steps of:
   forming a predetermined relief pattern on a surface of said substrate; and
   epitaxially depositing a layer formed of a mixture of two or more Group III elements and two or more Group V elements on said surface wherein two of said Group III elements are Gallium (Ga) and Indium (In), and one of said Group V elements is Nitrogen (N); and wherein
   said relief pattern results in said layer deposited in a single step forming with a different ratio between said Gallium (Ga) and Indium (In) within areas on said surface having different relief pattern characteristics, said difference in the ratio between the Gallium (Ga) and the Indium (In) altering the amount of Nitrogen (N) which is incorporated into said layer, the different Nitrogen (N) incorporation within said different areas providing different band gaps within said different areas.

2. A method as claimed in claim 1, wherein one of said Group V elements is Arsenic (As).

3. A method as claimed in claim 1, wherein two of said Group V elements are Arsenic (As) and Antimony (Sb).

4. A method as claimed in claim 1, wherein at least one of said semiconductor components is a photonic component.

5. A method as claimed in claim 1, wherein at least one of said semiconductor components is an electronic component.

6. A method as claimed in claim 1, wherein a plurality of said semiconductor components are separate independent components.

7. A method as claimed in claim 1 wherein a plurality of said semiconductor components are linked components.

8. A method as claimed in claim 1, wherein said relief pattern forming step is carried out by selectively etching the substrate.

9. A method as claimed in claim 1, wherein the relief pattern comprises ridges bordered by sloping facets.

10. A method as claimed in claim 9, wherein at least one of said facets has a slope corresponding to the integer indices (n 1 1).

11. A method as claimed in claim 9, wherein at least one of said facets has a slope corresponding to the integer indices.

12. A method as claimed in claim 9, wherein the relief pattern characteristics of a ridge are defined by the ratio of its surface area to its edge length.

13. A method as claimed in claim 1, wherein the epitaxial deposition step is carried out using molecular beam epitaxy.

14. A method as claimed in claim 1, wherein said relief pattern forming step is carried out by covering said substrate with a thin dielectric layer and subsequently removing said dielectric layer from selected areas.

15. A method as claimed in claim 1, wherein the epitaxial deposition step is carried out using molecular organic vapour phase epitaxy.

16. A semiconductor device produced in accordance with the method of claim 1.

* * * * *